(12) United States Patent
Simon et al.

(10) Patent No.: US 9,217,756 B2
(45) Date of Patent: Dec. 22, 2015

(54) LEVER MECHANISMS FOR ANTI-PHASE MODE ISOLATION IN MEMS TUNING-FORK STRUCTURES

(71) Applicant: The Regents of the University of California, Oakland, CA (US)

(72) Inventors: Brenton R. Simon, Irvine, CA (US); Alexander A. Trusov, Irvine, CA (US); Andrei M. Shkel, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 337 days.

(21) Appl. No.: 13/840,362

(22) Filed: Mar. 15, 2013

(65) Prior Publication Data

US 2014/0260615 A1    Sep. 18, 2014

(51) Int. Cl.
*G01C 19/56* (2012.01)
*G01C 19/5621* (2012.01)
*G01P 15/097* (2006.01)
*H03H 9/24* (2006.01)
*H03H 9/02* (2006.01)

(52) U.S. Cl.
CPC .......... *G01P 15/097* (2013.01); *G01C 19/5621* (2013.01); *H03H 9/2463* (2013.01); *H03H 9/2468* (2013.01); *H03H 2009/02496* (2013.01)

(58) Field of Classification Search
CPC .......... G01C 19/5719; G01C 19/5747; G01C 19/56; G01C 19/5607; G01C 19/5649; G01C 19/5642; G01C 19/5663; G01C 19/5635; G01C 19/5621

USPC .............. 73/504.12, 504.14, 504.16, 504.02, 73/504.04
See application file for complete search history.

(56) References Cited

U.S. PATENT DOCUMENTS

| | | | |
|---|---|---|---|
| 6,742,389 B2 * | 6/2004 | Nguyen et al. | 73/504.12 |
| 6,843,127 B1 * | 1/2005 | Chiou | 73/504.12 |
| 7,043,985 B2 * | 5/2006 | Ayazi et al. | 73/504.04 |
| 7,284,429 B2 * | 10/2007 | Chaumet et al. | 73/504.12 |
| 8,061,201 B2 * | 11/2011 | Ayazi et al. | 73/504.12 |
| 8,322,213 B2 * | 12/2012 | Trusov et al. | 73/504.12 |
| 8,844,357 B2 * | 9/2014 | Scheben et al. | 73/504.12 |
| 8,991,247 B2 * | 3/2015 | Trusov et al. | 73/504.12 |
| 2010/0313657 A1 * | 12/2010 | Trusov et al. | 73/504.16 |

* cited by examiner

*Primary Examiner* — Helen Kwok
(74) *Attorney, Agent, or Firm* — Marcus C. Dawes; Daniel L. Dawes

(57) ABSTRACT

A MEMS resonator includes two resonating masses having an anti-phase and in-phase resonance mode, each mode having a resonance frequency, and an anti-phase resonance levering system coupled to the two resonating masses to stiffen and/or dampen the in-phase resonance mode while leaving the anti-phase resonance mode compliant. This effectively raises the in-phase resonance frequency above the anti-phase resonance frequency, and potentially creates a large frequency separation between the two resonance modes. This reduces the energy transfer between the two modes, allowing for robustness to external acceleration, because the in-phase mode is of a higher frequency. The anti-phase resonance levering system is disposed between the two resonating masses as an internal levering mechanism, or is disposed around the two resonating masses as an external levering mechanism.

21 Claims, 16 Drawing Sheets

REDUCING ENERGY TRANSFER TO ANTI-P.

$$\ddot{x}_{in} + w_{in}^2 x_{in} = a(t) \qquad \frac{x_{an}}{x_{in}} = \frac{\Delta k}{2m(w_{an}^2 - w_{in}^2)} \qquad T_{in} = \frac{Q_{in}}{w_{in}}$$

| Method: | Reduce initial in-phase amplitude | Reduce energy transfer anti-phase | Increase in-phase energy dissipation |
|---|---|---|---|
| Technique: | Raise in-phase frequency | Expand frequency separation | Reduce in-phase Q-factor |

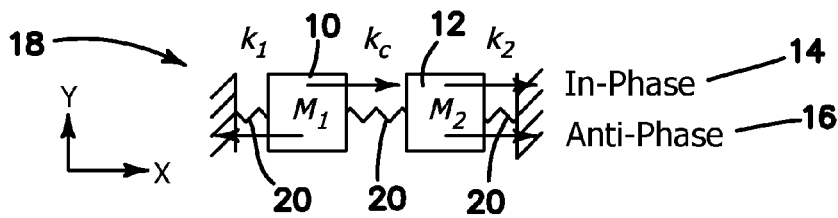

FIG. 1

▫ Raising in-phase frequency aids in all techniques above

INTERNAL COUPLING MODIFICATION

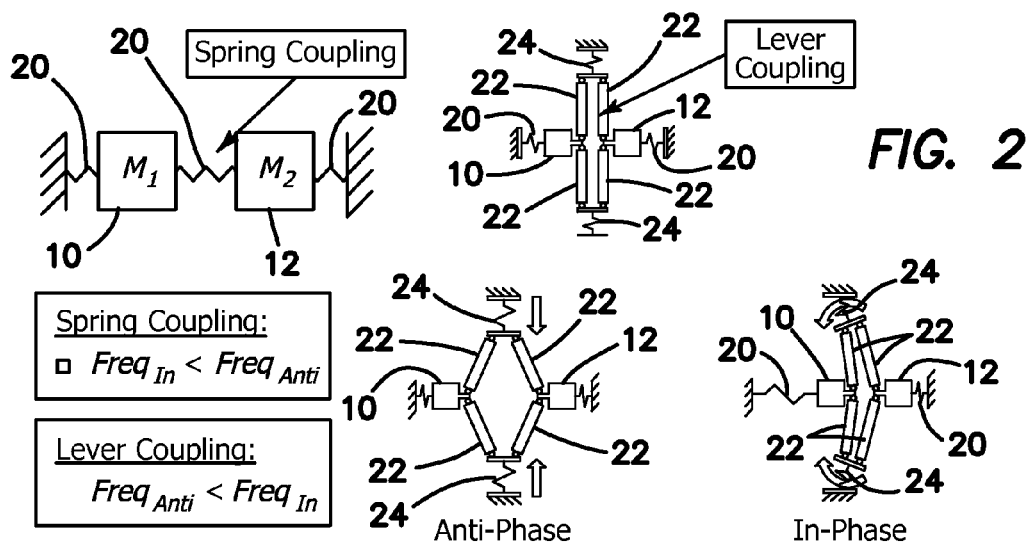

FIG. 2

Spring Coupling:
▫ $Freq_{In} < Freq_{Anti}$

Lever Coupling:
$Freq_{Anti} < Freq_{In}$

▫ Levers stiffen in-phase, leaving anti-phase compliant

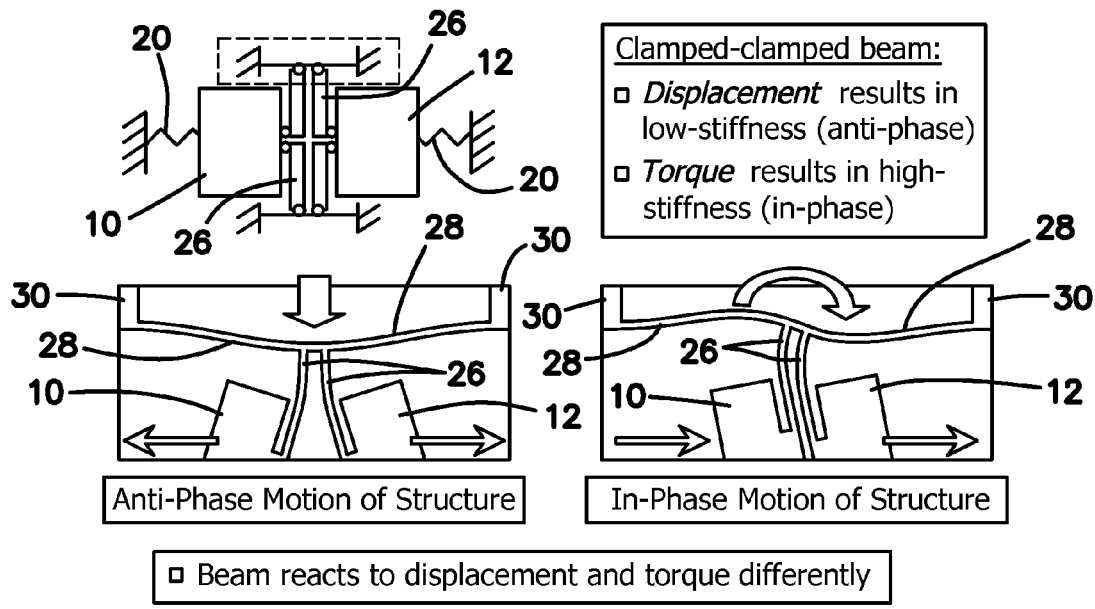
FIG. 3
$$(1)\cdots \frac{y}{L} = 1-\sin\left(\cos^{-1}\left(\frac{x}{L}\right)\right)$$
$$(2)\cdots \frac{y}{L} = .05\left(\frac{x}{L}\right)^2$$
FIG. 4
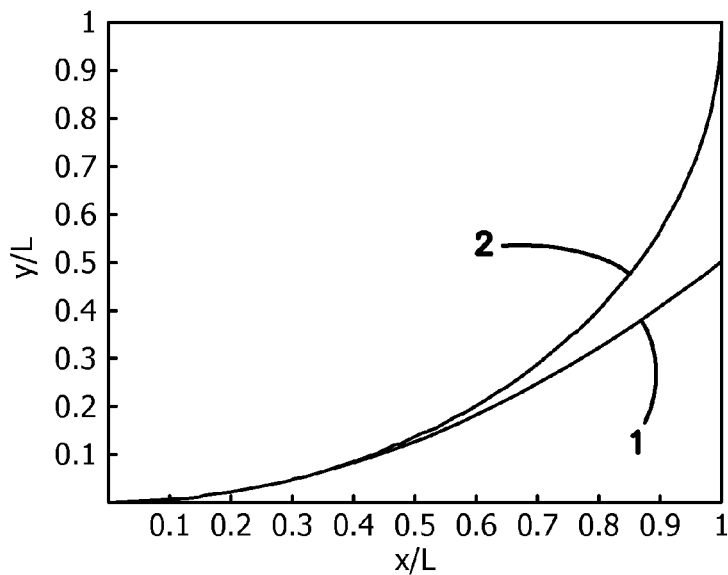

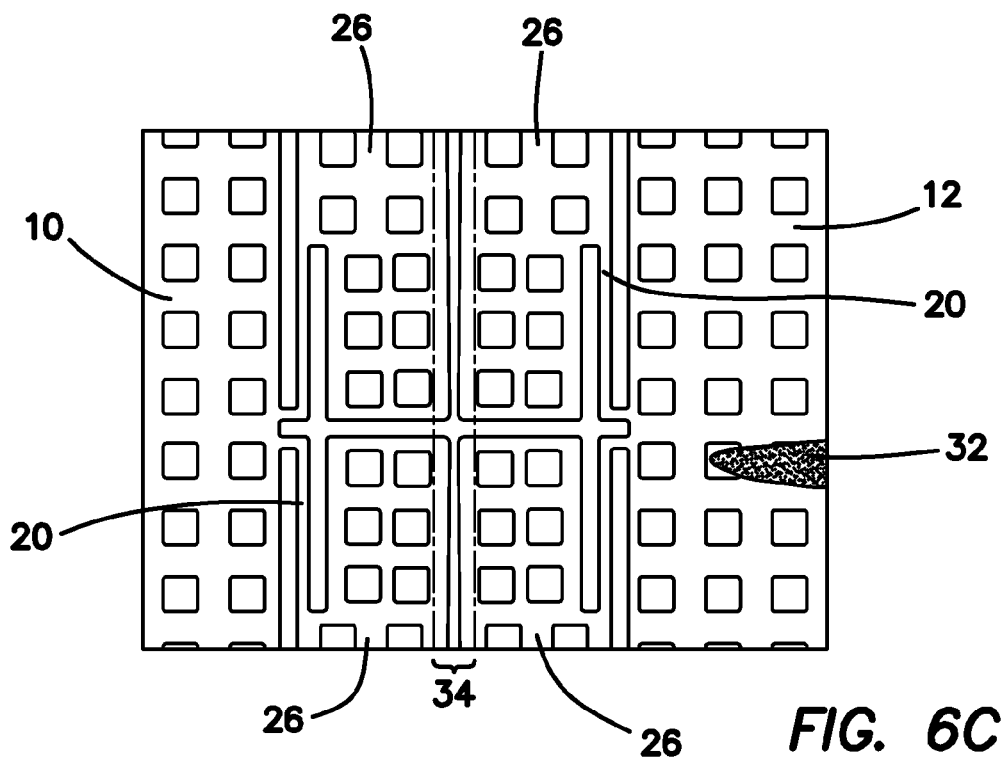
FIG. 6C
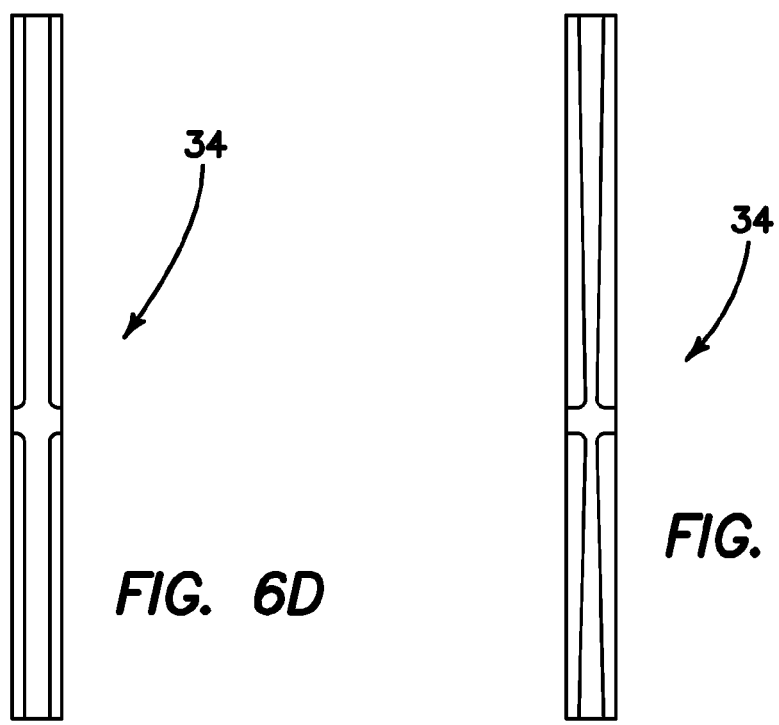
FIG. 6D
FIG. 6E

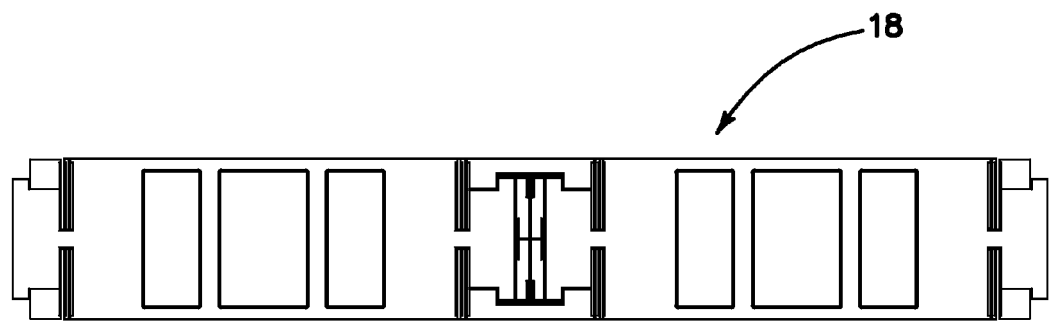
Mode 1: 4462 Hz (Anti-Phase)
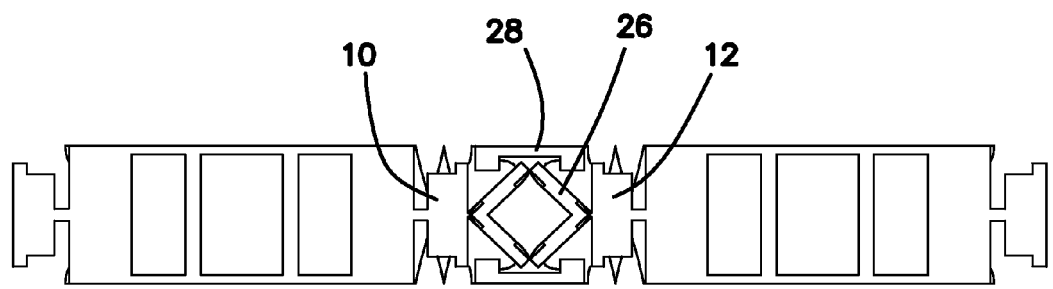
Mode 2: 11350 Hz (In-Phase)
Mode 3: 11887 Hz (Spring torsion-Not shown)
FIG. 8

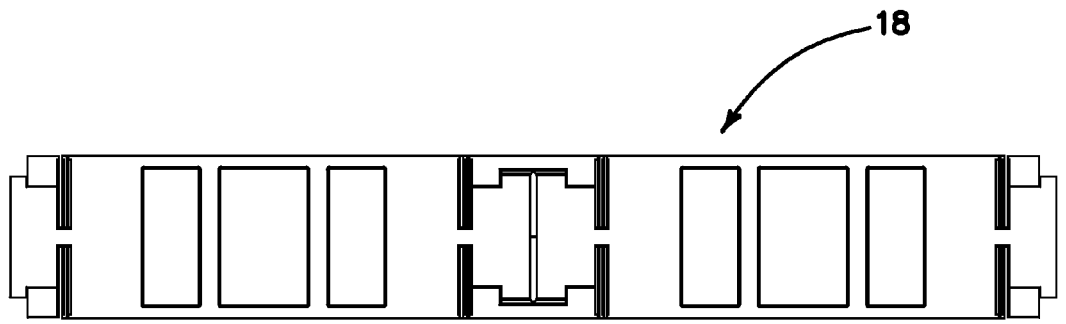
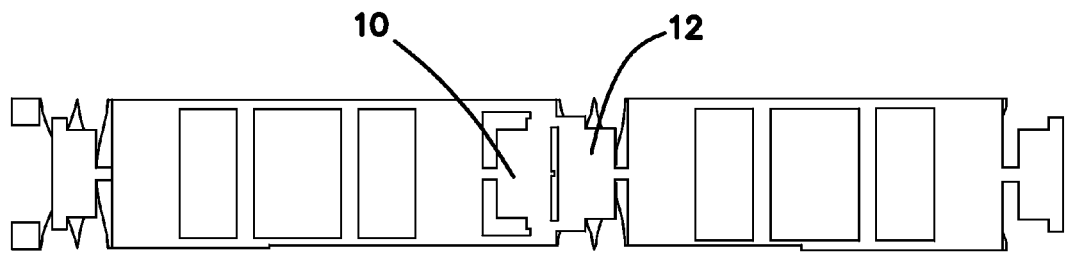
Mode 1: 2119 Hz (In-Phase)
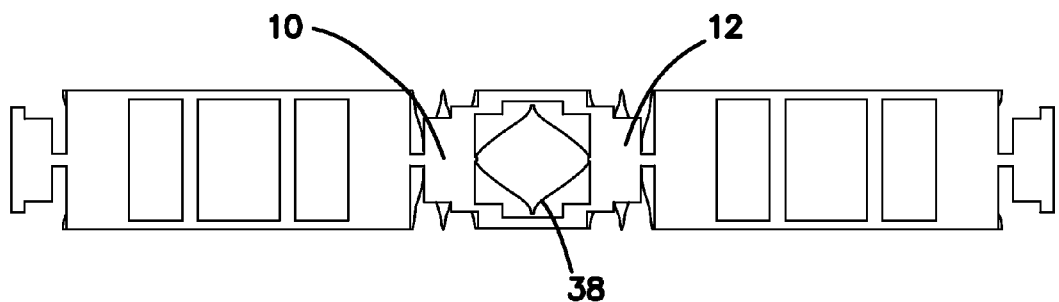
Mode 2: 4080 Hz (Anti-Phase)
Mode 3: 11159 Hz (Spring torsion-Not shown)
FIG. 10

QMG RESONANCES - SPRING COUPLING

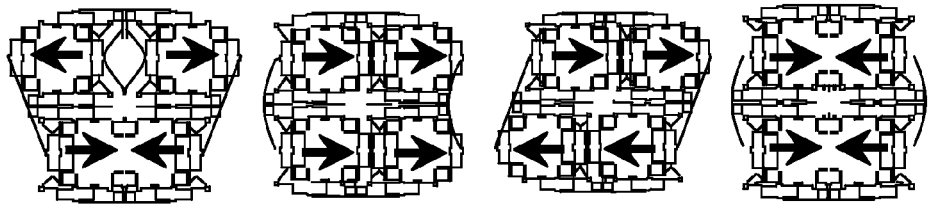

| Anti-Phase (A) | In-Phase (B) | Hybrid (C) | Hybrid (D) |
|---|---|---|---|

Sensitivity:
- None
- Acceleration
- Torsion
- None

Resonance:
- 2.6 kHz
- 3.1 kHz
- 2.5 kHz
- 3.2 kHz

- Existing QMG separates in- / anti-phase by 20%

FIG. 15
PRIOR ART

QMG RESONANCES - LEVER COUPLING

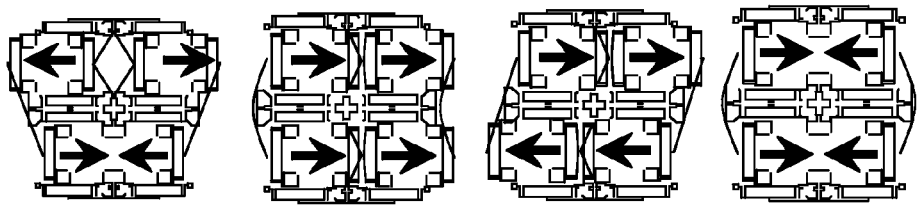

| Anti-Phase (A) | In-Phase (B) | Hybrid (C) | Hybrid (D) |
|---|---|---|---|

Sensitivity:
- None
- Acceleration
- Torsion
- None

Resonance:
- 2.6 kHz
- 5.4 kHz
- 4.7 kHz
- 3.8 kHz
- No change
- ↑ +73%
- ↑ +85%
- ↑ +18%

- New coupling separates in- / anti-phase by 110%

FIG. 16

LEVER MECHANISMS FOR ANTI-PHASE MODE ISOLATION IN MEMS TUNING-FORK STRUCTURES

GOVERNMENT RIGHTS

This invention was made with government support under N00014-09-1-0424 awarded by National Institutes of Health. The government has certain rights in the invention.

BACKGROUND

1. Field of the Technology

The disclosure relates to the field of micromachined inertial sensors, tuning fork architecture, resonators, gyroscopes, and accelerometers.

2. Description of the Prior Art

Quality factor is a important characteristic for the performance of many types of mechanical resonators employed as sensors. With the consideration of micromachined vibratory gyroscopes and rate-integrating gyroscopes, maximizing the quality factor increases sensitivity to external rotation and reduction of the signal-to-noise ratio. One method of increasing the quality factor for these types of devices is through the use of multiple-mass resonators operating in anti-phase vibratory modes. These types of resonators offer larger quality factors by balancing the linear and angular momentum of the actuating structure and reducing energy loss into the substrate.

BRIEF SUMMARY

The illustrated embodiments feature two design structures for use in high-Q MEMS tuning fork resonators, as well as any tuning-fork device utilizing an anti-phase resonance for other purpose, such as reduction of g-sensitivity. These structures are able to stiffen and dampen the in-phase tuning fork resonance mode while leaving the high-Q anti-phase resonance mode compliant. This feature effectively raises the in-phase resonance frequency, and potentially creates a large frequency separation between the two resonance modes. The primary benefit of these structures is to reduce energy transfer between the two modes, allowing a higher robustness to external acceleration. The large frequency separation alone offers an advantage towards this effect. However, because the in-phase mode is of a higher frequency which is not typical in most environments, this mode is even less likely to be excited for most applications. The reduction of external energy transfer to the modes of interest is important for high-Q structures, as even if a small amount of energy is transferred to the high-Q mode, this energy will continue to oscillate within the mode and disturb sensitive measurements.

The two designs which have been implemented to produce this effect include first one that can be placed between the two resonance tuning fork tines and a second that can be wrapped around the structure. While both have been shown to increase the frequency separation of the two resonance modes, the internal levering mechanism has the added benefit of requiring less space and potentially being applied to quadruple mass devices. This has an additional benefit for gyroscopes by reducing quadrature between the two modes of resonance. These designs can also be used to create FM accelerometers with large, non-linear mechanical scale factors by placing the in- and anti-phase resonances close together.

An additional benefit of the design is potential frequency robustness to temperature through proper design and fabrication of the structure. Most silicon resonators exhibit a negative frequency drift with increasing temperature due to the softening of the Young's Modulus. Because the primary stiffness of the discussed design structures is contributed from a clamped-clamped beam, mismatch in the thermal expansion coefficients between the material of the device and the substrate can induce force within the beam to produce a positive frequency drift with increasing temperature. Combining the two effects with proper design can produce at least first-order temperature drift cancellation.

The MEMS resonator of the illustrated embodiments includes two resonating masses having an anti-phase and in-phase resonance mode, each mode having a resonance frequency, and an anti-phase resonance levering system coupled to the two resonating masses, where the in-phase resonance frequency is higher than the anti-phase resonance frequency, while the anti-phase resonance is left compliant.

More specifically, the illustrated embodiments of the invention include a MEMS resonator which includes two resonating masses having an anti-phase and in-phase resonance mode, each mode having a resonance frequency, and an anti-phase resonance levering system coupled to the two resonating masses to stiffen and dampen the in-phase resonance mode while leaving the anti-phase resonance mode compliant by effectively raising the in-phase resonance frequency, and potentially creating a large frequency separation between the two resonance modes, so that energy transfer is reduced between the two modes, allowing for robustness to external acceleration, where the in-phase mode is of a higher frequency.

In a first embodiment the anti-phase resonance levering system is disposed between the two resonating masses as an internal levering mechanism.

In a second embodiment the anti-phase resonance levering system is disposed around the two resonating masses as an external levering mechanism.

The illustrated embodiments also include a combination of the internal and external levering mechanism disposed between and around the two resonating masses respectively.

In one embodiment the internal levering mechanism is incorporated into a quadruple mass device to reduce quadrature between the anti-phase and in-phase resonance mode In another embodiment the levering system is used in an FM accelerometer with a large, non-linear mechanical scale factor by setting the in- and anti-phase resonance frequencies close together.

In an illustrated embodiment the MEMS resonator is formed on a substrate, and the anti-phase resonance levering system includes a clamped-clamped beam coupling between the two masses so that the stiffness and dampening of the in-phase resonance mode and induced force within the clamped-clamped beam coupling produces a positive frequency drift with increasing temperature, where the stiffness and dampening and induced force combine to produce at least a first-order temperature drift cancellation of the mismatch in the thermal expansion coefficients between the material of the resonator and the substrate. The damping of the anti-phase resonance mode remains high compared to that of the damping of the in-phase resonance mode.

The anti-phase resonance levering system increases the Q-factor of the anti-phase resonance mode by reducing the impact of structural asymmetries.

The MEMS resonator is formed on a substrate, and temperature robust resonance frequencies are achieved by fabricating the two masses and anti-phase resonance levering system, on one hand, and the substrate, on the other hand from materials with different thermal expansion coefficients.

The MEMS resonator may be embodied as a tuning fork assembly, accelerometer or gyroscope.

The anti-phase resonance levering system causes simple linear displacement, anti-phase motion, and induces torque in-phase motion.

The anti-phase resonance levering system has a greater resistance to torque than displacement, so that the in- and anti-phase resonance frequencies can be swapped, and the in-phase frequency resonance increased.

The anti-phase resonance levering system includes a clamped-clamped beam coupling between the two masses.

In one embodiment the two resonating masses and an anti-phase resonance levering system comprises a Coriolis vibratory gyroscope.

In still another embodiment the MEMS resonator further includes two additional resonating masses for a total of four resonating masses having an anti-phase (A) and in-phase (B) resonance mode, and two hybrid modes of resonance (C and D), each mode having a resonance frequency, where masses are coupled pairwise by the anti-phase resonance levering system to stiffen the in-phase resonance (B), as well as one of the hybrids (C), raising the frequency of modes B and C higher than the anti-phase resonance frequency.

The two resonating masses and an anti-phase resonance levering system constitutes an FM accelerometer having a scale factor, where the anti-phase resonance levering system is arranged and configured to set in-phase and anti-phase resonance frequency of the two resonating masses close together with the anti-phase resonance frequency placed lower in comparison to allow the anti-phase resonance to be the first mode to fail through physical contact of the masses, and thus allowing for the observation of the non-linear stiffness effect on the increase in scale factor with displacement.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The disclosure can be better visualized by turning now to the following drawings wherein like elements are referenced by like numerals.

BRIEF DESCRIPTION OF THE DRAWINGS

FIG. 1 is a table summary and diagram of three methods for reducing energy transfer between in- and anti-phase resonances.

FIG. 2 is a table summary and diagram of design change to allow for an anti-phase resonance with lower stiffness than the corresponding in-phase resonance, showing the lever coupling.

FIG. 3 are diagrams of a flexing structure or clamped-clamped beams that fundamentally reacts differently to anti-phase and in-phase motion of the attached structure.

FIG. 4 is a graph of the displacement of X and Y directions of motion of the tines or masses in FIG. 3 normalized against length of each lever, L.

FIGS. 6a-6e are static deformation diagram where one tine induces an identical anti-phase deformation in the coupled tine for the resonator with the internal levering mechanism.

FIG. 6a is a photograph of the entire resonator structure with identified region of photographs. FIG. 6b is an optical photograph of the region of interest without an external force applied by probe. FIG. 6c is an optical photograph of the region of interest with an external force applied by probe. FIG. 6d is a cropped and enlarged region of the structure before deformation by probe in FIG. 6b. FIG. 6e is a cropped and enlarged region of the structure deformed by probe.

FIG. 8 are diagrams depicting an embodiment of anti-phase resonator design with the internal levering mechanism.

FIG. 10 are diagrams modeling an anti-phase resonator design without the internal levering mechanism. The tuning fork masses are connected to one another though a simple, minimal stiffness flexure spring.

FIG. 12a is a general layout diagram. FIG. 12b depicts a first resonance mode at 2501 Hz, and anti-phase sense (thermoelastic damping Q, $Q_{TED}$ of $1.45 \times 10^6$). FIG. 12c shows a second mode at 2550 Hz, anti-phase drive ($Q_{TED}$ of $1.31 \times 10^6$). FIG. 12d shows a third resonance mode at 3869 Hz, in-phase drive ($Q_{TED}$ of $3.57 \times 10^4$). FIG. 12e shows a fourth resonance mode at 4676 Hz, in-phase sense ($Q_{TED}$ of $2.58 \times 10^4$).

FIG. 13a is a layout diagram of the embodiment. FIG. 13b is a depiction of a first resonance mode at 110 kHz, anti-phase ($Q_{TED}$ of 86 k). FIG. 13c is a diagram of a second resonance mode at 185 kHz, vertical resonance ($Q_{TED}$ of 78 k). FIG. 13d is a third resonance mode at 186 kHz, in-phase ($Q_{TED}$ of 47 k).

FIG. 15 are diagrams which summarize the four primary vibratory modes of a prior art quadruple mass gyroscope with spring coupling.

FIG. 16 are diagrams which summarize the four primary vibratory modes of a quadruple mass gyroscope with lever coupling of the present invention.

Figure 5A:
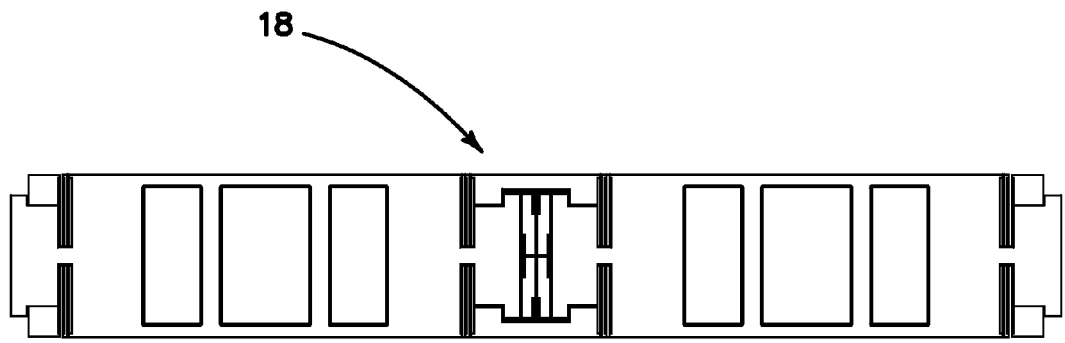
FIGS. 5a and 5b are modeling schematics of internal levering mechanism used in a resonator.

The disclosure and its various embodiments can now be better understood by turning to the following detailed description of the preferred embodiments which are presented as illustrated examples of the embodiments defined in the claims. It is expressly understood that the embodiments as defined by the claims may be broader than the illustrated embodiments described below.

DETAILED DESCRIPTION OF THE PREFERRED EMBODIMENTS

The illustrated embodiments of the invention improve the design of tuning-fork structures. Generally speaking, tuning-forks are symmetric resonators that are operated using anti-phase motion. They consist of at least two masses or tines 10, 12, and are each driven independently with equal magnitude and opposite directional force as shown in FIG. 1. These masses or tines 10, 12 inherently have more than one mode of resonance, namely an anti-phase mode 16, as well as an in-phase mode 14, where both masses 10, 12 displace in the same direction. It is the in-phase mode 14, which we attempt to avoid with the anti-phase resonance because it is sensitive to external acceleration, and dissipates energy through the anchors of the structure (not shown) due to unbalanced linear momentum, thus lowering Q-factor. Both of these effects are avoided with an ideal anti-phase motion. These types of masses or tines 10, 12 are commonly used for many types of vibratory MEMS devices, including resonators, accelerometers and gyroscopes, each with the explicit purpose of robustness to acceleration and raising Q-factor of the anti-phase mode.

Tuning-forks 18, though, are not without their challenges. The tuning-fork design relies on complete symmetry of the tuning-fork 18 to completely isolate the anti-phase from the in-phase resonance. This means that any spring 20 or mass 10, 12 only contribute to force on one of the mass 10 or 12 and it must be equal to its mirrored mass 12 or 10 respectively. In reality, fabrication imperfections prevent this from occurring. There is always a mismatch in stiffness and mass between the two masses 10 or 12. Fabrication imperfections have a much greater effect on the narrow beams that typically make up flexures (not shown), when compared to mass mismatch. So when we focus on the stiffness mismatch and transform the resonance of tuning fork 18 into anti- and in-phase components, we can see that there is energy coupling between the two resonances, which is proportional to the stiffness mismatch. When comparing the amplitude coupling between these two modes, we can also see that it is inversely proportional to the frequency separation between the in- and anti-phase modes 14 and 16.

Expanding the frequency separation between the in- and anti-phase modes 14, 16 is one technique we can use in order to reduce the transfer of energy from the in-phase mode 14 into the anti-phase mode 16. Another technique is to increase the stiffness of the in-phase resonance to reduce the initial amount of displacement caused by a given amount of acceleration. Finally, reducing the in-phase Q-factor, as well as increasing the in-phase resonance frequency, lowers the time constant of the resonance, allowing any resonant energy within the in-phase resonance to quickly dissipate. It is important to note that all three of these techniques, as shown in FIG. 1, would be aided if we could simply place the in-phase frequency higher than the anti-phase frequency, and raise it as high as possible, while leaving the anti-phase resonance compliant.

The issue with this strategy is the existing spring coupling of traditional tuning-forks 18. The anti-phase resonance will always be stiffer than the in-phase resonance, because it requires the spring 20, $k_c$, to flex. By replacing this structure with levers 22, used to reduce and transform this motion 90 degrees, we can fundamentally change how in-phase and anti-phase motion behave on this the lever 22 as diagrammatically illustrated in FIG. 2. Anti-phase motion causes simple linear displacement, while in-phase motion induces torque. As long as we choose an anti-phase resonance levering system 22, 24 that has a greater resistance to torque than displacement, we can swap the in- and anti-phase resonances, and push the in-phase frequency as high as possible.

As it turns out, this anti-phase resonance levering system 22, 24 can be as simple as a clamped-clamped beam 28 as shown diagrammatically in FIG. 3. During anti-phase displacement of the levers 26, the clamped-clamped beams 28 is pulled downward as shown in FIG. 3, deforming the beam 28 into its first mode of resonance. When the tuning fork 18 undergoes in-phase displacement, a torque is placed on the beam 28, forcing it into its stiffer second mode of resonance. Because of this fundamentally different behavior dependent upon the vibratory mode actuated, we are able to swap the in-phase and anti-phase resonances, and stiffen the in-phase resonance as high as possible, to help accomplish all three of our goals.

An interesting benefit to the design is that the clamped-clamped beam 28 acting as springs can be considerably stiffer than the springs 20, k.sub.c, directly attached to the masses or tines 10, 12 themselves. FIG. 4 is a graph that compares the normalized displacement along the x-axis verses the y-axis for the idealized schematic in FIG. 2, along with a low-displacement power fit for the curve. With an exponent of two present in the fitted equation, it is shown that there is a single order of magnitude difference in the displacement of the two axes. With the increased stiffness of this vertical resonance, a lower susceptibility to vertical acceleration is expected.

Figure 5B:
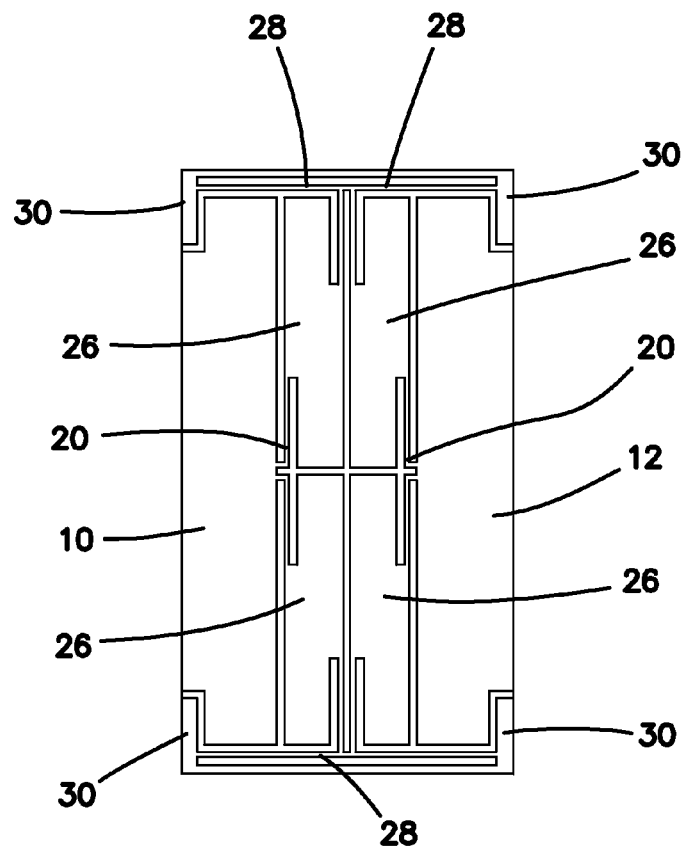
Figure 6A:
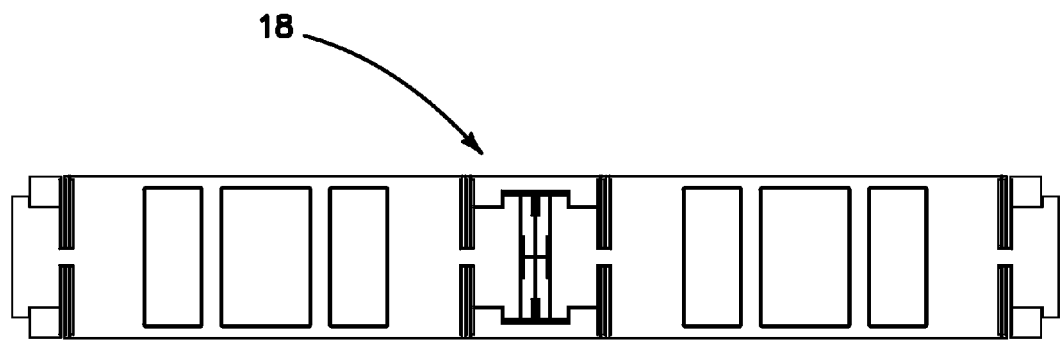
Figure 6B:
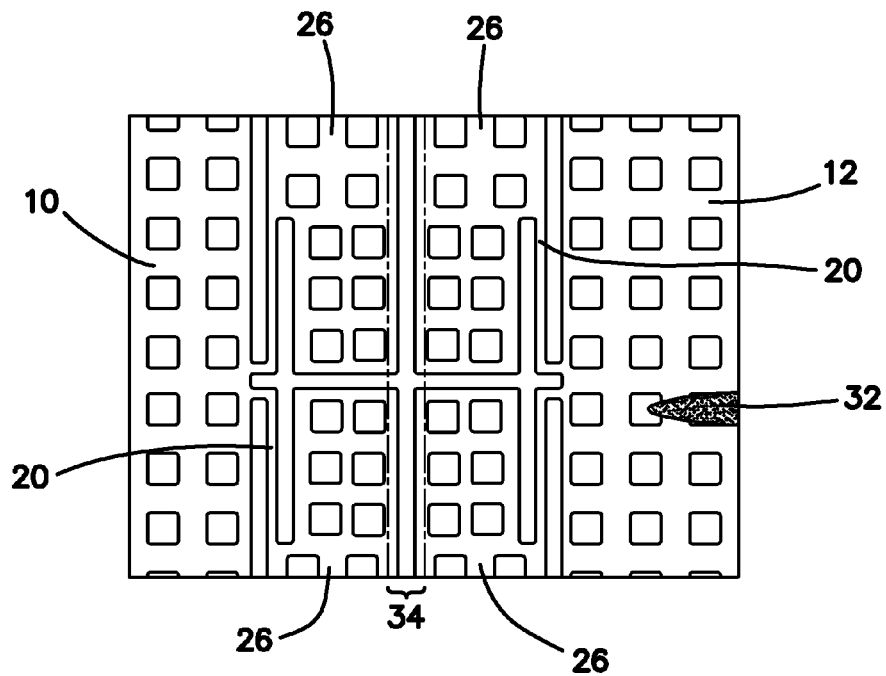

FIGS. 5a and 5b display a detailed layout diagram of embodiment of the invention for use in a low-frequency resonator. FIG. 5a is a layout diagram of the entire tuning fork 18, while FIG. 5b is a layout diagram for the masses 10, 12 and their springs 20, clamped-clamped beam 28 and levers 26. FIGS. 6a-6e are optical photographs of a fabricated resonator of this embodiment with and without mechanical probing of a single proof mass. When a single proof mass is deflected, the opposite proof mass deforms in the opposite direction, indicating that the anti-phase deflection is the mode shape with lowest stiffness. FIG. 6a shows the overall layout of tuning fork 18 while FIG. 6b is a close up on the springs 20 and levers 26 in an undeformed state unacted upon by a probe 32. FIG. 6c is the close up of FIG. 6b after probe has deformed springs 20 and levers 26. FIG. 6d is a cropped and enlarged region of the spacing between levers 26 in region 34 of FIG. 6b when the levers 26 are undeformed by probe 32. The gap can be seen to be substantially uniform along its length. FIG. 6e is a cropped and enlarged region of the spacing between levers 26 in region 34 of FIG. 6c when the levers 26 are deformed by probe 32. The gap can be seen to be substantially nonuniform along its length with the levers 26 torqued inward toward the center point of the tuning fork 18. This indicates experimentally that anti-phase motion is less stiff than in-phase motion.

Figure 7:
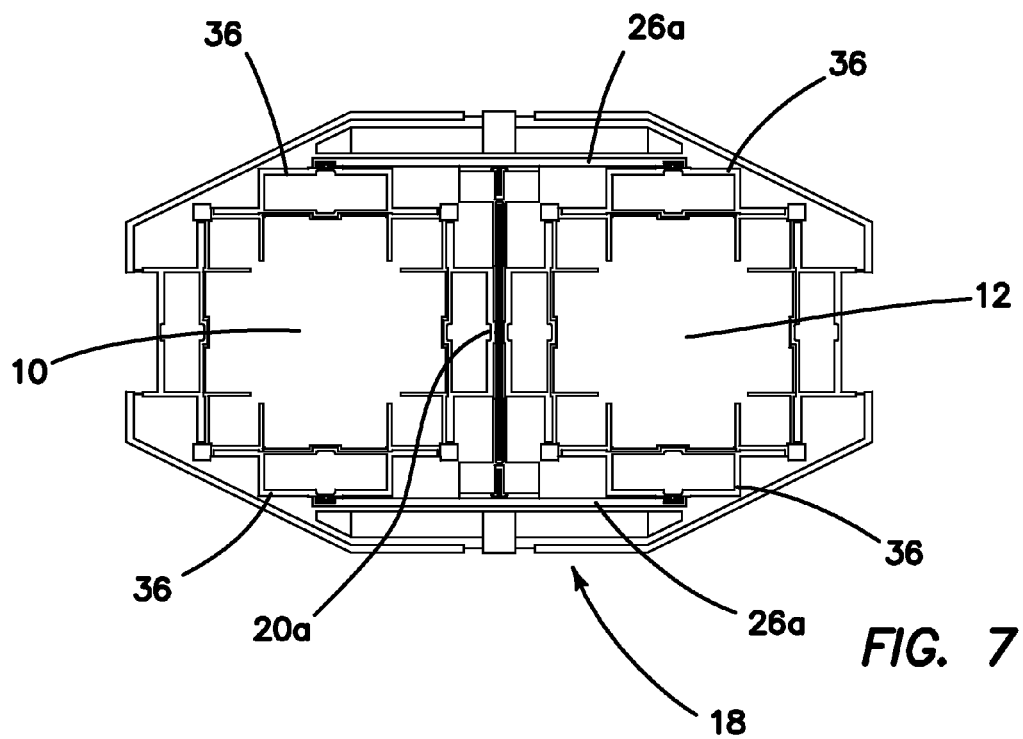
FIG. 7 is a diagram showing another embodiment having an external levering mechanism for stiffening the in-phase tuning fork mode.

While the above work is focused on the internal levering mechanism, an alternative embodiment is also disclosed, which allows for a similar effect. Instead of placing the levering mechanism of levers 26 between the two vibratory masses 10, 12, levers or beams were expanded around the outside of the device to produce the same effect. FIG. 7 shows an example of this design, having been applied to a dual-mass tuning-fork gyroscope. Beams 26a are coupled to masses 10, 12 by vertical shuttles 36. Masses 10, 12 are coupled to a central spring 20a. This embodiment requires considerably more space than the internal levering embodiment disclosed in connection with FIGS. 5a-6e, however, there are two potential benefits. First, should the internal portion of the tuning fork 18 need to be used for another purpose, this embodiment would increase space available for such a modification. Second, this embodiment could potentially be used in combination with the internal levering design, thus creating even further frequency separation between the in-phase and anti-phase resonances.

Figure 9:
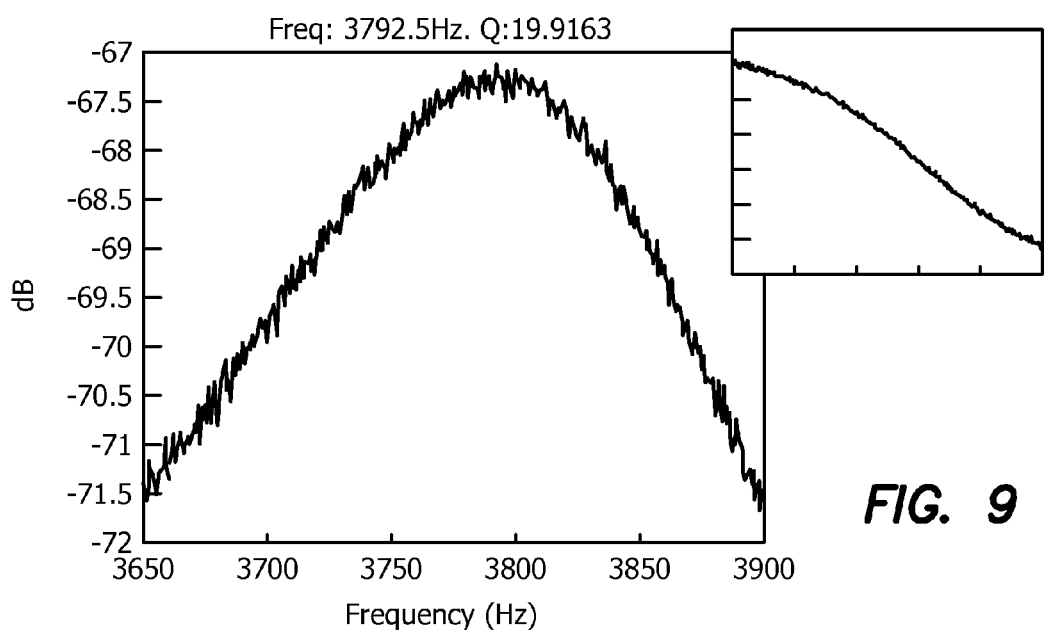
FIG. 9 is a graph of the experimental characterization of the anti-phase resonance mode of the resonator embodiment with the internal levering mechanism. Experiments were completed with both single-sided actuation and detection of both tines, using comb drives and parallel plate electrodes respectively. The anti-phase mode had a peak at 3793 Hz, a quality factor Q of 20. Note that the in-phase mode was undetectable due to the low-displacement/high-stiffness associated with the mode.
Figure 11A:
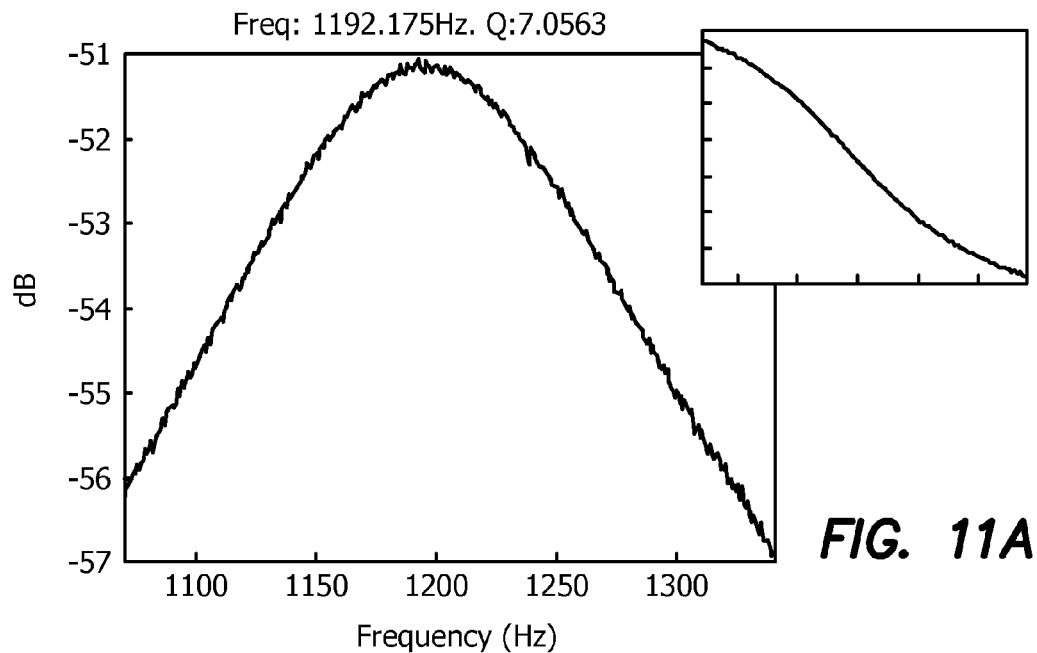
FIGS. 11a and 11b are experimental characterizations of the lowest two resonance modes of the resonator embodiment of FIG. 10 without the internal levering mechanism.
Figure 11B:
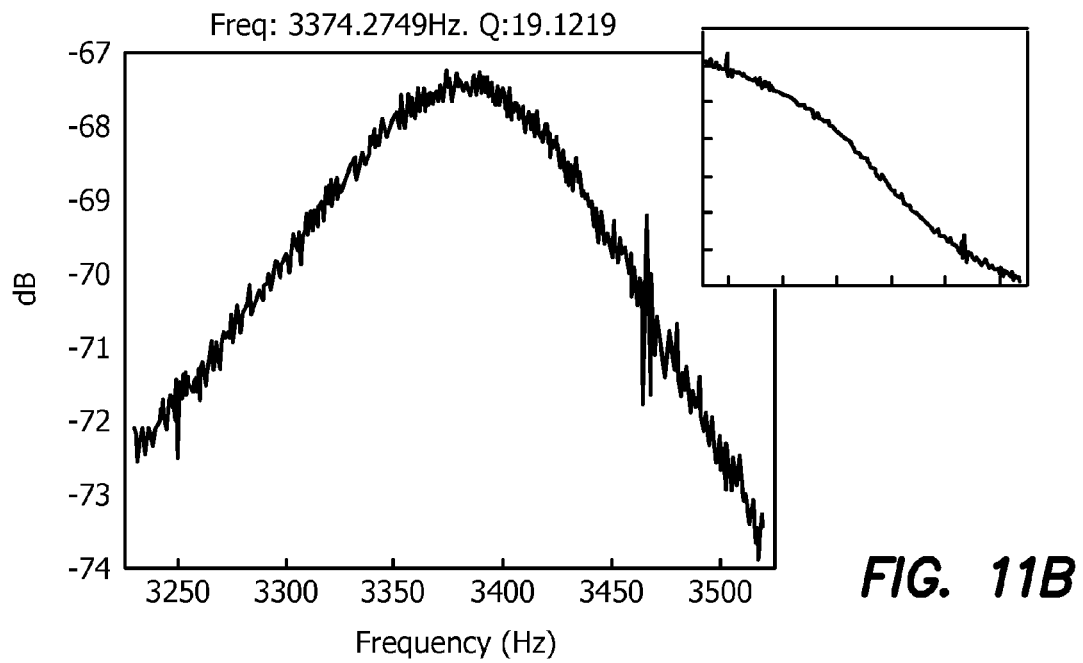

Finite element modeling was first used to qualify the disclosed embodiments. Identical resonators were modeled, except one was coupled using the disclosed internal levering as diagrammatically depicted in FIG. 8, and the second used a simple spring coupling shown in FIG. 10. According to the internal levering model, the anti-phase resonance of both embodiments is approximately 4 kHz; however, the in-phase resonance increased from 2 kHz to 11 kHz, for the lever-coupled embodiment of FIG. 8. These results were then experimentally confirmed through fabrication of the devices using a silicon-on-insulator fabrication process with the resonance response as a function of frequency for the anti-phase mode shown in FIG. 9. No in-phase response was measurable. The modeling of anti-phase resonator embodiment without the internal levering mechanism having tuning fork masses connected to one another though a simple, minimal stiffness flexure spring is depicted in FIG. 10 with the experimental results given by the graph of FIGS. 11a and 11b. FIGS. 11a and 11b are experimental characterizations of the lowest two resonance modes of the resonator embodiment as a function of frequency without the internal levering mechanism. Experiments were completed with both single-sided actuation and detection of both tines, using comb drives and parallel plate electrodes respectively. FIG. 11a shows the in-phase mode with a peak at 1192 Hz and quality factor Q of 7. FIG. 11b shows the anti-phase mode with a peak at 3374 Hz and a quality factor Q of 20.

Figure 12A:
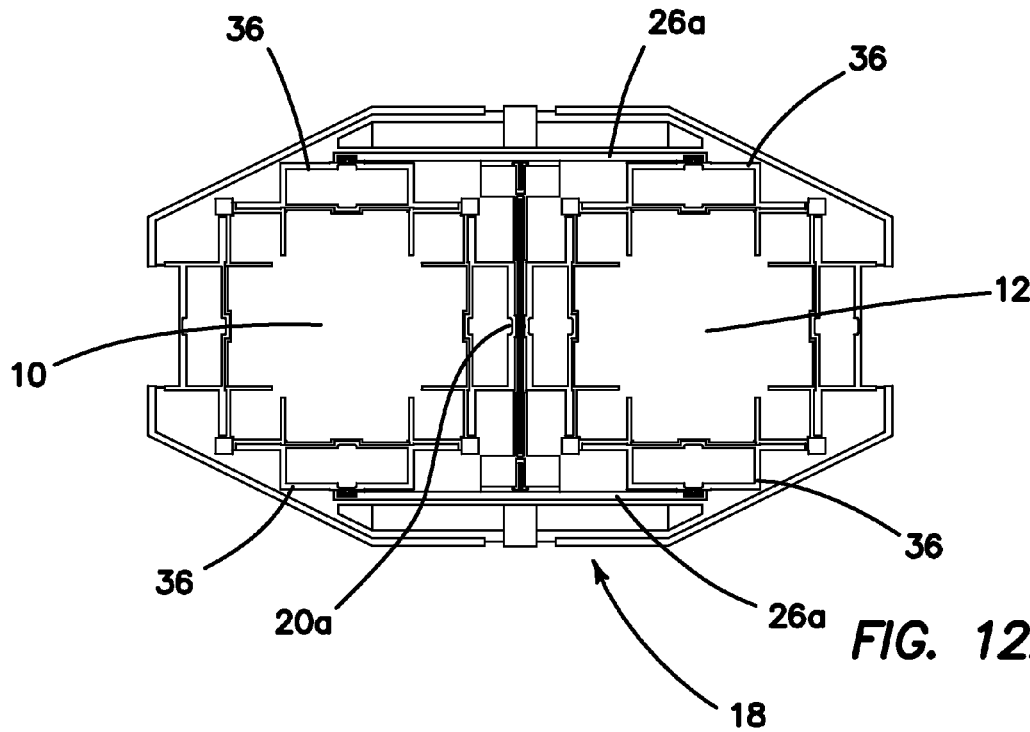
FIGS. 12a-12e are diagrams modeling an external levering mechanism which stiffens in-phase resonance of the tuning fork mode, applied to a dual-mass gyroscope.
Figure 12B:
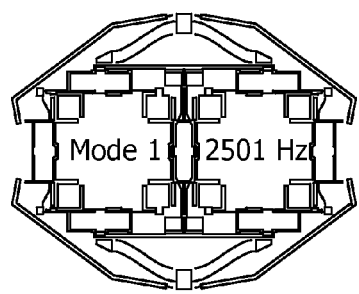
Figure 12C:
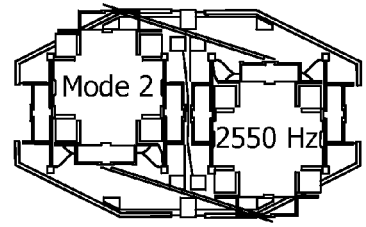
Figure 12D:
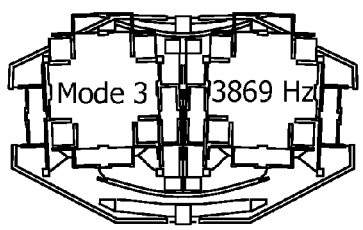
Figure 12E:
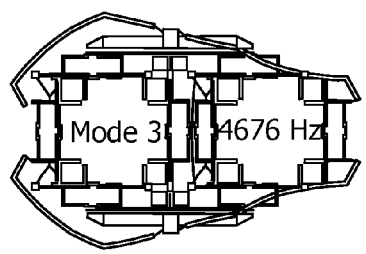

The external levering embodiment was also modeled for the dual-mass tuning-fork gyroscope of FIG. 7. The results of this modeling are shown in the diagrams of FIGS. 12a-12e. FIG. 12a shows the external levering embodiment. While FIGS. 12c and 12d show a secondary mode, FIGS. 12b and 12e show the anti-phase resonance of the tuning fork and in-phase resonance, respectively. A frequency separation of approximately 100% can be seen between FIGS. 12b and 12e, which is comparable of similar designs using the internal lever coupling.

Figure 13A:
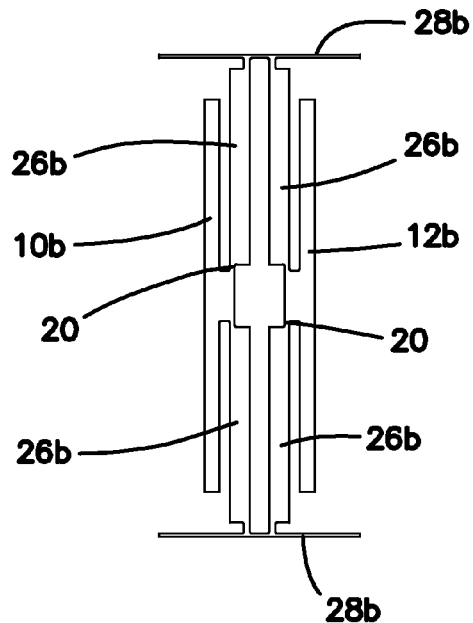
FIGS. 13a-13d are diagrams modeling of a higher frequency resonator embodiment using the internal levering mechanism.
Figure 13B:
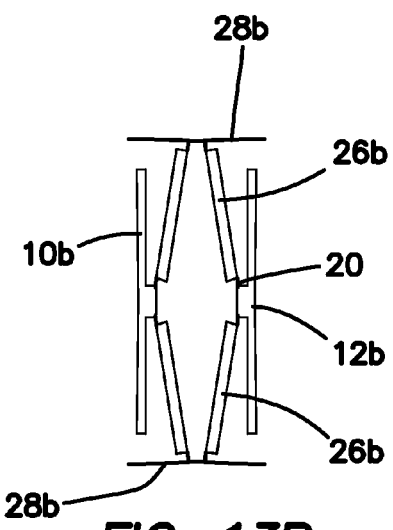
Figure 13C:
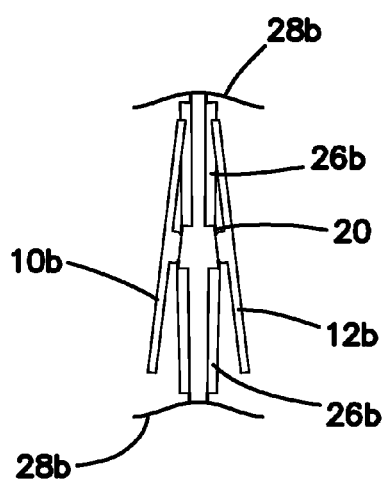
Figure 13D:
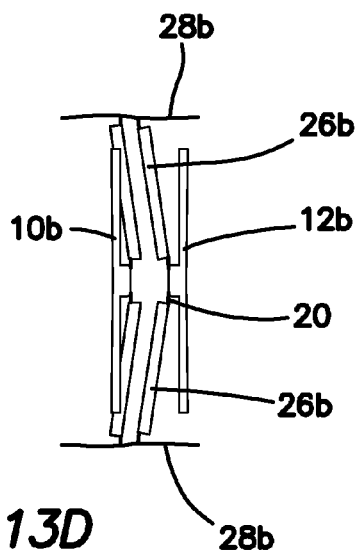

One consequence to the disclosed embodiment is that, due to the complexity of the design space that is required, high frequency tuning forks 18 are not possible. By streamlining the design, a maximum anti-phase frequency of approximately 100 kHz is predicted, as depicting in the diagram of in FIGS. 13a-13d. FIGS. 13a-13d are diagrams modeling of a higher frequency resonator embodiment using the internal levering mechanism. FIG. 13a is a layout diagram of the embodiment showing the high frequency masses 10b, 12b, springs 20, clamped-clamped levers 28b and levers 26b. FIG. 13b is a depiction of a first resonance mode at 110 kHz, anti-phase ($Q_{TED}$ of 86 k). FIG. 13c is a diagram of a second resonance mode at 185 kHz, vertical resonance ($Q_{TED}$ of 78 k). FIG. 13d is a third resonance mode at 186 kHz, in-phase ($Q_{TED}$ of 47 k).

Figure 14:
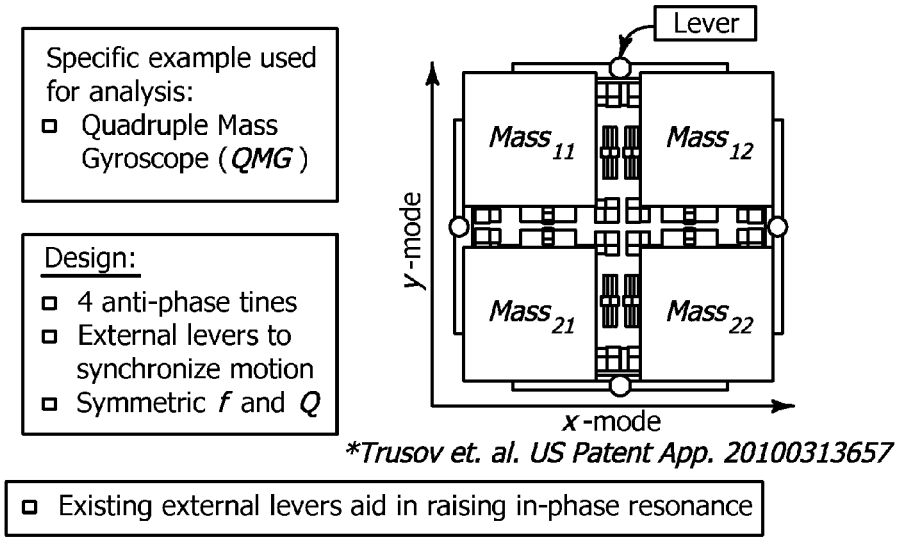
FIG. 14 is a schematic diagram of prior art quadruple mass gyroscope with external lever to force anti-phase motion along two axes.

One of the proposed uses of the disclosed embodiments is for Coriolis vibratory gyroscopes. In order to experimentally validate this, as well as demonstrate how easily the modification can be made to existing high-performance tuning-fork structures, we implemented this design within an existing quadruple mass gyroscope as shown in FIG. 14. Instead of being comprised of only two masses, like traditional tuning-forks, four masses are used to create ideal symmetry between two different axes of motion: a drive mode and a sense mode. We can think of this device as two separate dual-mass tuning-forks, synchronized together with external levers. These external levers force anti-phase motion, as well as raise the critical in-phase frequency of the device by forcing the external levers to bend.

However, with the additional complexity of four masses, there are not just simply an anti-phase and an in-phase resonance, but rather additional modes are created, which are hybrids of these two original modes as depicted in the diagrams of FIG. 15. The external levers are able to stiffen the in-phase resonance, as well as one of the hybrids, raising the frequency of these modes to roughly 20% higher than the anti-phase resonance, according to finite element modeling. However, these external levers have no impact on the second hybrid mode, which is specifically sensitive to torsion. In this way, Hybrid mode "C" is similar to the in-phase motion of the dual-mass resonator discussed earlier, where the resonance frequency is seen to be slightly less than the complete anti-phase motion of mode "A".

Due to the versatility of the disclosed embodiments of the lever coupling design, we were able to simply replace the existing spring coupling with a modest modification to the pre-existing structure. While the existing external levers of the conventional tuning fork aid in stiffening the in-phase mode and one hybrid modes to force anti-phase motion, the new internal levers further stiffen the in-phase resonance, as well as the second hybrid mode that was previously unaffected.

After replacing the spring coupling of the tuning fork of FIG. 14 with a lever coupling, hybrid mode "C" has been stiffened by 85%, compared to the spring-coupled design, as well as a similar stiffness increase for the complete in-phase mode, all while leaving the anti-phase resonance unchanged as illustrated in FIG. 16. While the external levers alone were capable of a 20% separation between the in- and anti-phase modes, the addition of the lever coupling has expanded this separation to 110%.

Figure 17:
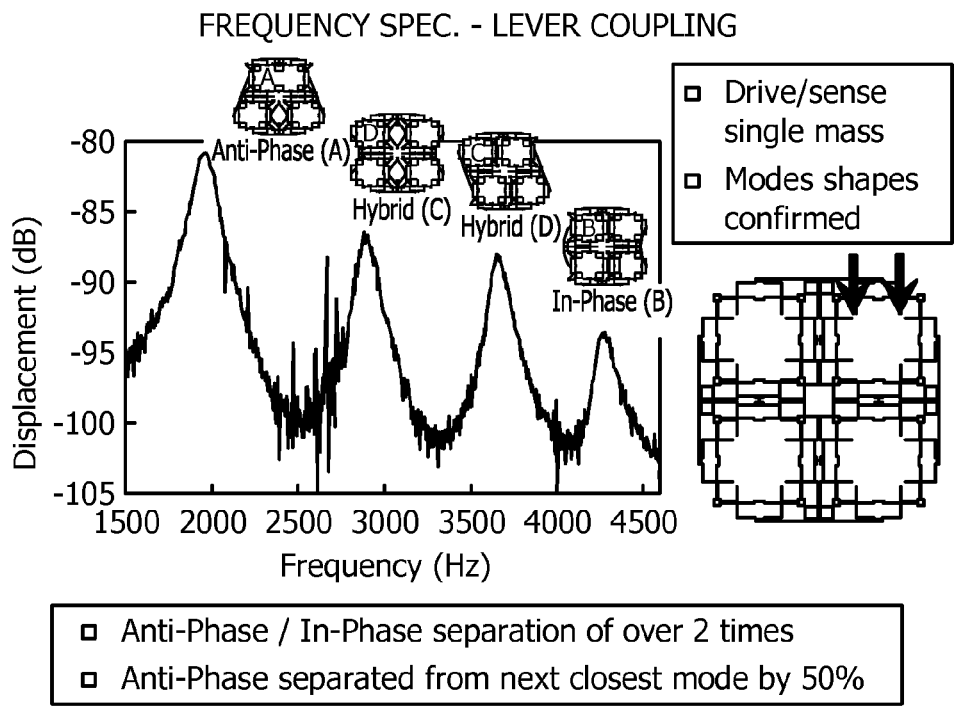
FIG. 17 is a diagram of the frequency spectrum of the quadruple mass gyroscope with lever coupling showing a large frequency separation between the anti-phase and in-phase modes.

Quad mass tuning forks with both spring and lever couplings were then fabricated using a standard silicon-on-insulator fabrication process. The device layer used was 100 microns thick, with 5 microns of buried oxide, a 500 micron substrate, and patterned metallization on the backside. These wafers were patterned, etched, released and packaged using an eutectic solder die attachment process. By actuating and sensing from a single mass of the final fabricated, levered-coupled tuning fork, four resonance peaks could be seen, each corresponding to one of the four predicted modes as illustrated in FIG. 17. These modes were then confirmed by detecting the motion of all four masses and modifying the polarization of each to reflect the motion of each predicted mode shape. As anticipated, the anti-phase mode is now the lowest frequency mode with over two times separation between the in-phase resonance. Furthermore, the next highest mode is separated from it by nearly 50%.

Figure 18:
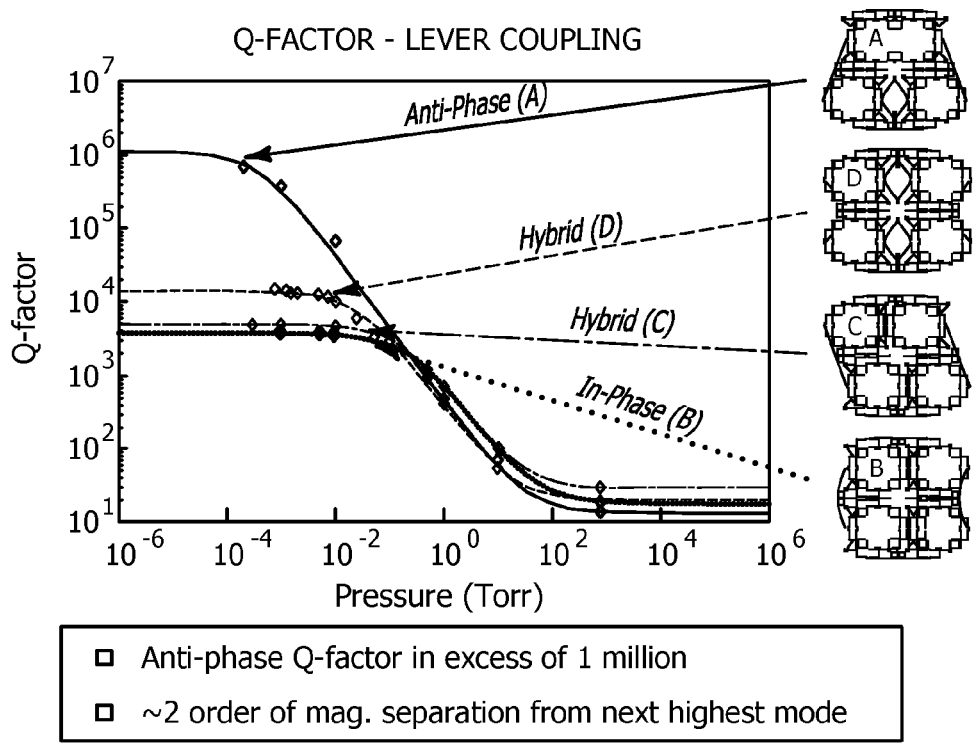
FIG. 18 is a graph of the anti-phase Q-factor isolation for a quadruple mass gyroscope with lever coupling.

Quadruple mass devices using the internal lever coupling were then placed in a vacuum chamber and Q-factor was measured for each resonance from atmosphere to 0.1 mTorr as summarized by the diagrams of FIG. 18. A typical damping curve was then fitted for each data set, with the in-phase and hybrid modes reaching maximum Q-factors from 4,000 to 15,000. The Q-factor of the complete anti-phase mode was still increasing at 0.1 mTorr and projected to reach 1.1 million once viscous damping has been eliminated. This results in approximately two orders of magnitude separation from the other three extraneous resonances.

Figure 19:
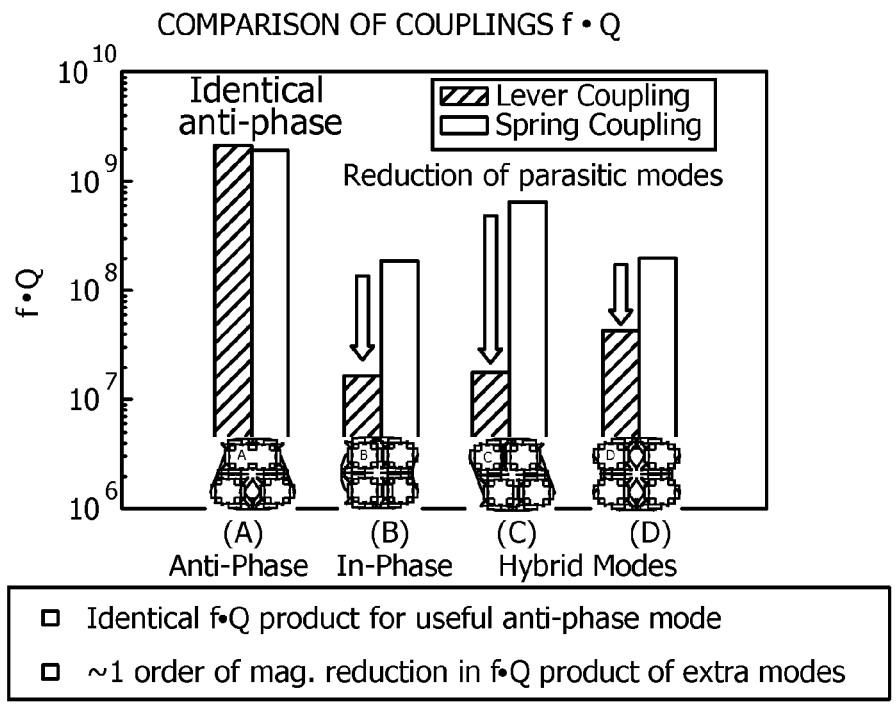
FIG. 19 is a bar chart comparing the frequency-Q product for spring and lever couplings for a quadruple mass gyroscope.

When comparing the frequency/Q-factor product of each of the resonance modes for the original spring-coupled and proposed lever-coupled quadruple mass tuning forks, a drop of over one magnitude can be seen for both the in-phase, as well as Hybrid mode "C". This results in a final two orders of magnitude separation between the anti-phase and complete in-phase modes of resonance as depicted in the comparison bar chart of FIG. 19.

The embodiments of the internal levering mechanism disclosed above can potentially be designed to assist in increasing the temperature robustness of the frequency of the resonator for both internal and external levering embodiments. If the above silicon structures were bonded to a glass substrate with a different thermal expansion coefficient, an axial force will be induced into clamped-clamped beam 26 and have an impact upon the stiffness according to the equation below.

$$k = \frac{16Ehw^3}{L^3}\left(1 + \frac{9NL^2}{\pi^2 EI}\right) \quad [73]$$

Where both E and N are temperature dependant and are the Young's modulus of silicon and axial load in the beam, respectively. The axial load of the beam can be found using the equation below.

$$N = \sigma A = E \cdot \Delta T (\alpha_2 - \alpha_1) wh$$

The above two equations can be combined to form the following equation for stiffness, comprised of both a negative trend in stiffness for increasing temperature, as well as a positive trend.

$$k(\text{Negative Trend})(\text{Positive Trend}) = \left(\frac{16Ehw^3}{L^3}\right)\left(1 + \frac{9L^2 \cdot \Delta T(\alpha_2 - \alpha_1) wh}{\pi^2 I}\right)$$

This temperature compensation technique could potentially result in a mechanical resonator with first order temperature compensation.

Figure 20:
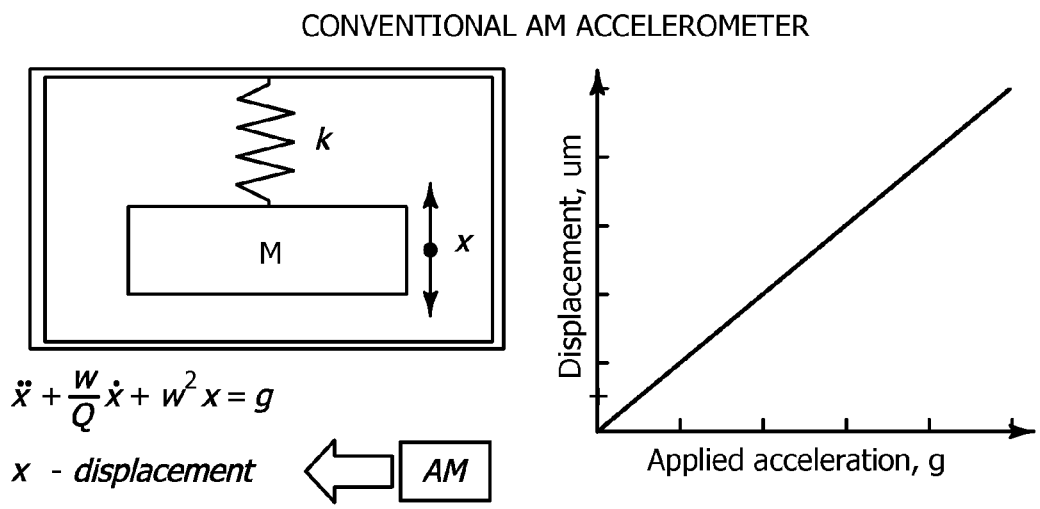
FIG. 20 is a diagram and graph which summarizes the performance and design of conventional amplitude modulated (AM) accelerometers.

The lever coupling embodiments not only have applications for resonators and gyroscopes, but to frequency modulated accelerometers as well. While traditional amplitude modulated (AM) accelerometers are either static, or operated in a force-to-rebalance mode, the physical principle of the device is that a suspended proof mass is deflected linearly with applied acceleration as illustrated in FIG. 20.

Figure 21:
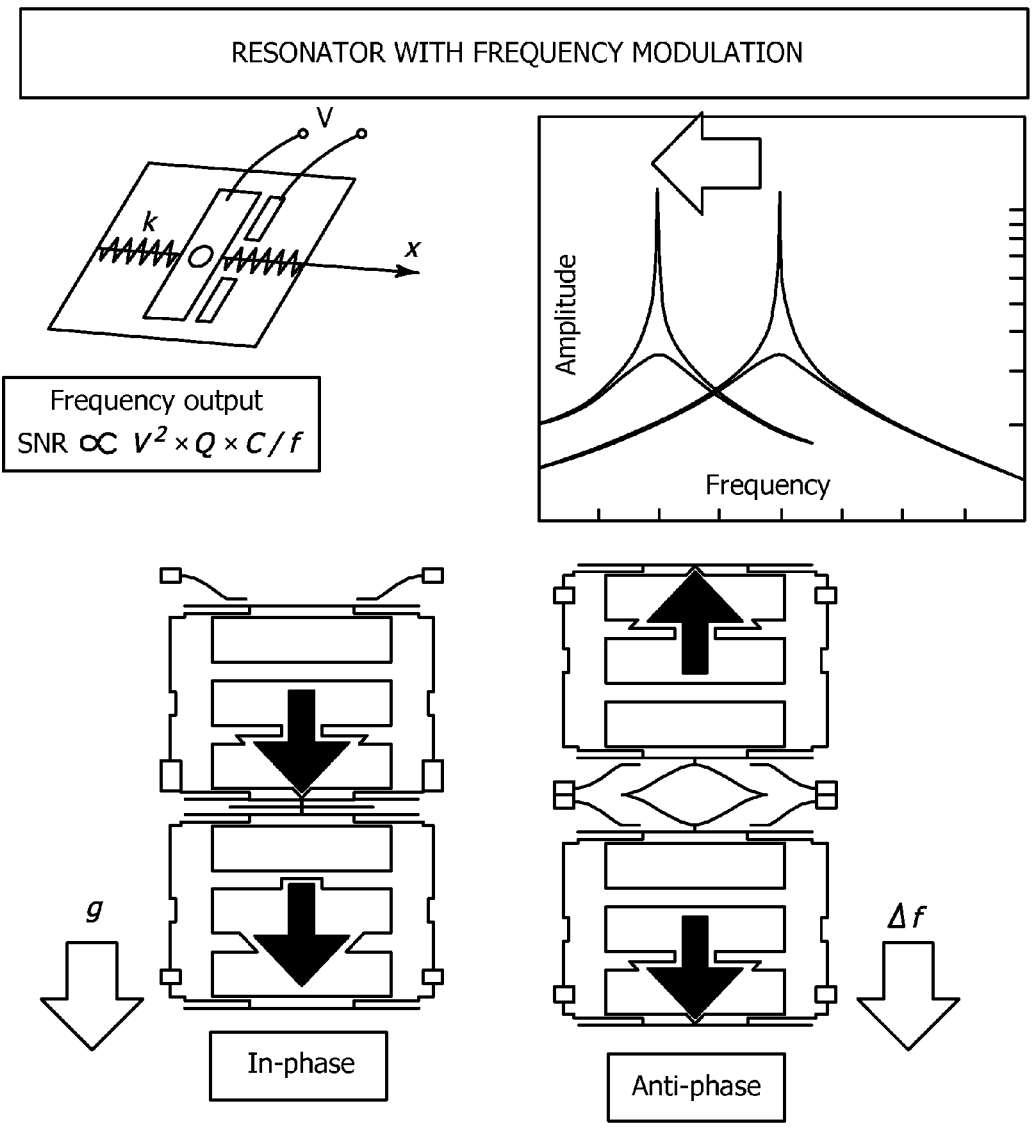
FIG. 21 is a diagram and graph which summarizes conventional frequency modulated (FM) accelerometers.

Frequency modulated (FM) accelerometer operate differently. Instead of tracking a mechanical displacement for the output of the device, the operator tracks a changing resonance frequency as illustrated in FIG. 21. This shifting resonance frequency is caused by an attached parallel plate capacitor with a large, constant voltage being applied. The nonlinear capacitance of the electrode with displacement creates an electrostatic spring effect, which in turn changes the resonance frequency of the device when both masses deflect in the same direction.

Figure 22:
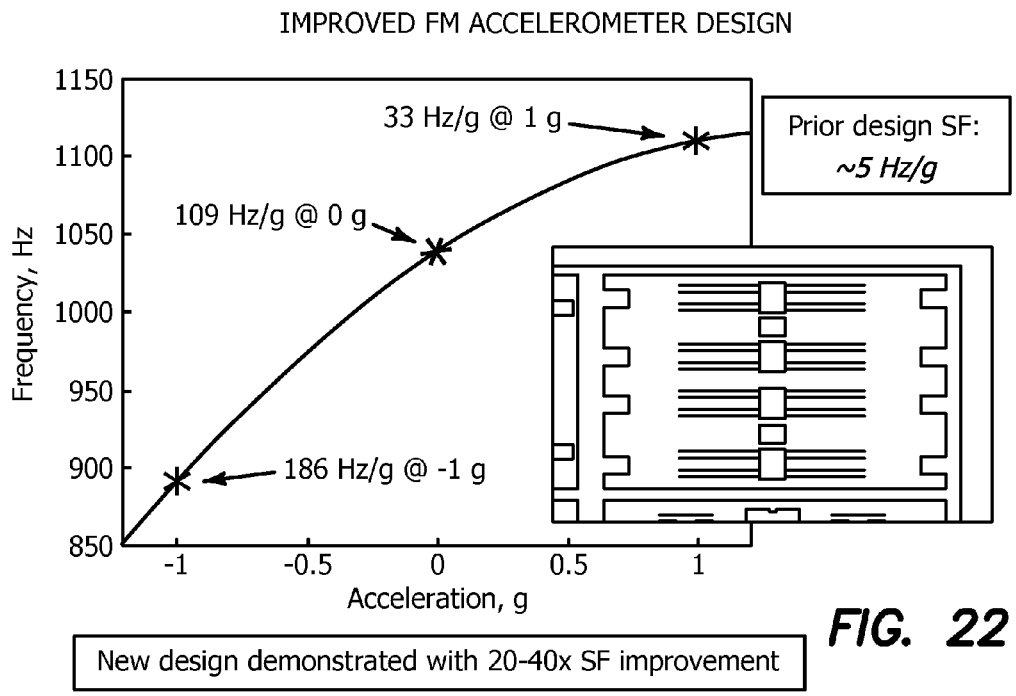
FIG. 22 is a graph of frequency of an accelerometer improved according to the present invention with an experimental demonstration of non-linear scale factor expansion through mode placement with the internal levering design structure.

An issue with the conventional FM accelerometer is that, if the in-phase stiffness is lower than the anti-phase resonance, the in-phase mode will be the first to fail by making contact with the plate. Because of this, the scale factor of a conventional FM accelerometer is limited to approximately 5 Hz/g. This can be greatly expanded by placing the in-phase and anti-phase resonance frequency very close together, with the anti-phase frequency placed slightly lower in comparison. This allows the anti-phase resonance to be the first mode to fail through physical contact of the proof mass, thus allowing for the experimental observation of the non-linear stiffness effect with displacement. This was experimentally demonstrated in connection with the graph of FIG. 22 with approximately a 20-40 times improvement in scale factor.

Many alterations and modifications may be made by those having ordinary skill in the art without departing from the spirit and scope of the embodiments. Therefore, it must be understood that the illustrated embodiment has been set forth only for the purposes of example and that it should not be taken as limiting the embodiments as defined by the following embodiments and its various embodiments.

Therefore, it must be understood that the illustrated embodiment has been set forth only for the purposes of example and that it should not be taken as limiting the embodiments as defined by the following claims. For example, notwithstanding the fact that the elements of a claim are set forth below in a certain combination, it must be expressly understood that the embodiments includes other combinations of fewer, more or different elements, which are disclosed in above even when not initially claimed in such combinations. A teaching that two elements are combined in a claimed combination is further to be understood as also allowing for a claimed combination in which the two elements are not combined with each other, but may be used alone or combined in other combinations. The excision of any disclosed element of the embodiments is explicitly contemplated as within the scope of the embodiments.

The words used in this specification to describe the various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the embodiments.

We claim:

1. A MEMS resonator comprising:
    two resonating masses having an anti-phase and in-phase resonance mode, each mode having a resonance frequency; and
    an anti-phase resonance levering system coupled to the two resonating masses to stiffen and/or dampen the in-phase resonance mode while leaving the anti-phase resonance mode compliant by effectively raising the in-phase resonance frequency above the anti-phase resonance frequency, and potentially creating a large frequency separation between the two resonance modes, so that energy transfer is reduced between the two modes, allowing for robustness to external acceleration, because the in-phase mode is of a higher frequency,
    wherein the anti-phase resonance levering system comprises a plurality of levers and a plurality of clamped-clamped beams, the plurality of levers coupled to the two resonating masses and to the plurality of clamped-clamped beams via a plurality of springs.

2. The MEMS resonator of claim 1 where the anti-phase resonance levering system is disposed between the two resonating masses as an internal levering mechanism.

3. The MEMS resonator of claim 1 where the anti-phase resonance levering system is disposed around the two resonating masses as an external levering mechanism.

4. The MEMS resonator of claim 2 where the anti-phase resonance levering system further comprises an external levering mechanism disposed around the two resonating masses.

5. The MEMS resonator of claim 2 where the internal levering mechanism is incorporated into a quadruple mass device to reduce quadrature between the anti-phase and in-phase resonance mode.

6. The MEMS resonator of claim 1 where the levering system is used in an FM accelerometer with a large, non-linear mechanical scale factor by setting the in-phase and anti-phase resonance frequencies close together.

7. The MEMS resonator of claim 1 formed on a substrate, where the anti-phase resonance levering system comprises a clamped-clamped beam coupling between the two masses so that the stiffness and damping of the in-phase resonance mode and induced force within the clamped-clamped beam coupling produces a positive frequency drift with increasing temperature, where the stiffness and damping and induced force combine to produce at least a first-order temperature drift cancellation of the mismatch in the thermal expansion coefficients between the material of the resonator and the substrate.

8. The MEMS resonator of claim 7 where the damping of the anti-phase resonance mode remains high compared to that of the damping of the in-phase resonance mode.

9. The MEMS resonator of claim 1 where the anti-phase resonance levering system increases the Q-factor of the anti-phase resonance mode by reducing the impact of structural asymmetries.

10. The MEMS resonator of claim 1 formed on a substrate, where temperature robust resonance frequencies are achieved by fabricating the two masses and the anti-phase resonance levering system, on one hand, and the substrate, on the other hand from materials with different thermal expansion coefficients.

11. The MEMS resonator of claim 1 where the two masses and the anti-phase resonance levering system comprise a tuning fork assembly, accelerometer or gyroscope.

12. The MEMS resonator of claim 1 where the anti-phase resonance levering system causes simple linear displacement in anti-phase motion, and induces torque in in-phase motion.

13. The MEMS resonator of claim 1 where the anti-phase resonance levering system has a greater resistance to torque than displacement, so that the in-phase and anti-phase resonance frequencies can be swapped, and the in-phase frequency resonance increased.

14. The MEMS resonator of claim 1 where the anti-phase resonance levering system comprises a clamped-clamped beam coupling between the two masses.

15. The MEMS resonator of claim 1 where the two resonating masses and the anti-phase resonance levering system comprises a Coriolis vibratory gyroscope.

16. The MEMS resonator of claim 3 further comprising two additional resonating masses for a total of four resonating masses having an anti-phase resonance mode (A) and in-phase (B) resonance mode, and two hybrid modes of resonance (C and D), each mode having a resonance frequency, where the four total masses are coupled pairwise by the anti-phase resonance levering system to stiffen the in-phase resonance mode (B), as well as one of the two hybrid modes (C), raising the frequency of the in-phase resonance modes B and one of the two hybrid modes C higher than the anti-phase resonance frequency.

17. The MEMS resonator of claim 1 where the two resonating masses and the anti-phase resonance levering system comprises an FM accelerometer having a scale factor, where the anti-phase resonance levering system is arranged and configured to set in-phase and anti-phase resonance frequency of the two resonating masses close together with the anti-phase resonance frequency placed lower in comparison to allow the anti-phase resonance to be the first mode to fail through physical contact of the masses, and thus allowing for the observation of the non-linear stiffness effect on the increase in scale factor with displacement.

18. A MEMS resonator comprising:
    two resonating masses having an anti-phase and in-phase resonance mode, each mode having a resonance frequency; and
    an anti-phase resonance levering system coupled to the two resonating masses, where the in-phase resonance frequency is higher than the anti-phase resonance frequency, while the anti-phase resonance mode is left compliant,
    wherein the anti-phase resonance levering system comprises a plurality of levers and a plurality of clamped-clamped beams, the plurality of levers coupled to the two resonating masses and to the plurality of clamped-clamped beams via a plurality of springs.

19. The MEMS resonator of claim 18 where the anti-phase resonance levering system is disposed between the two resonating masses as an internal levering mechanism.

20. The MEMS resonator of claim 18 where the anti-phase resonance levering system is disposed around the two resonating masses as an external levering mechanism.

21. The MEMS resonator of claim 19 where the anti-phase resonance levering system further comprises an external levering mechanism disposed around the two resonating masses.

* * * * *